(12) United States Patent
Lee et al.

(10) Patent No.: US 6,372,575 B1
(45) Date of Patent: Apr. 16, 2002

(54) METHOD FOR FABRICATING CAPACITOR OF DRAM USING SELF-ALIGNED CONTACT ETCHING TECHNOLOGY

(75) Inventors: Jeong Kug Lee, Seoul; Jong Phil Kim, Kyoungki-do, both of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/605,474

(22) Filed: Jun. 28, 2000

(30) Foreign Application Priority Data

Jun. 30, 1999 (KR) .............................. 99-25905

(51) Int. Cl.[7] ........................................ H01L 21/8242
(52) U.S. Cl. ...................... 438/253; 438/258; 438/639
(58) Field of Search ................................ 438/253, 254, 438/258, 238, 396, 639

(56) References Cited

U.S. PATENT DOCUMENTS

| | | | |
|---|---|---|---|
| 5,918,120 A | | 6/1999 | Huang .......................... 438/239 |
| 5,940,174 A | | 8/1999 | Lee et al. ..................... 438/396 |
| 6,001,685 A | * | 12/1999 | Kim ............................ 438/253 |
| 6,025,221 A | * | 2/2000 | Brown ......................... 438/238 |
| 6,025,247 A | * | 2/2000 | Chang et al. ................. 438/396 |
| 6,025,255 A | * | 2/2000 | Chen et al. .................. 438/595 |
| 6,037,216 A | * | 3/2000 | Liu et al. .................... 438/253 |
| 6,136,643 A | * | 10/2000 | Jeng et al. ................... 438/253 |
| 6,177,307 B1 | * | 1/2001 | Tu et al. ...................... 438/241 |

* cited by examiner

Primary Examiner—Olik Chaudhuri
Assistant Examiner—Kurt Eaton
(74) Attorney, Agent, or Firm—Nath & Associates PLLC; Gary M. Nath; Marvin C. Berkowitz

(57) ABSTRACT

The present invention discloses a method for fabricating a capacitor of a semiconductor device. In the conventional art, a bit line may be shifted or bent differently from the definition on a mask due to the stress resulting from a material difference between the bit line and BPSG film. However, in the present invention, the bit line is formed after depositing an oxide material on a contact plug, thereby preventing the shift or bending phenomenon and the short phenomenon between the metal interconnection contact and bit line. As a result, an open area is obtained during the formation step of a storage electrode, the insulating property between the bit line and storage electrode improves during the self aligned contact (SAC) etching step for forming a storage electrode contact hole, and the high speed and high integration of the semiconductor device are achieved by obtaining a sensing margin of the semiconductor device due to the capacitance reduction of the bit line, thereby enhancing a process yield and properties of the semiconductor device.

12 Claims, 5 Drawing Sheets

METHOD FOR FABRICATING CAPACITOR OF DRAM USING SELF-ALIGNED CONTACT ETCHING TECHNOLOGY

BACKGROUND OF THE INVENTION

The present invention relates to a method for fabricating a semiconductor device, and in particular to a method for fabricating a capacitor of a semiconductor device which can improve stability and reduce capacitance of a bit line, by enhancing an insulation property between the bit line and a storage electrode and a margin in the formation process of a storage electrode contact.

Recently, the high integration tendency of the semiconductor device has been remarkably influenced by development of minute pattern formation techniques. It is essential to miniaturize a photoresist film pattern that has been widely used as a mask for an etching or ion implantation step in the fabrication process of the semiconductor device.

Resolution (R) of the photoresist film pattern is proportional to a wavelength ($\lambda$) of a light source of a miniature exposer and a process variable (k), and inversely proportional to a numerical aperture (NA) of the exposer.

[$R=k^*\lambda/NA$, $R$=resolution, $\lambda$=wavelength of light source, NA=numerical aperture]

Here, the wavelength of the light source is reduced to improve photodecomposition of the miniature exposer. For example, the resolution of G-line miniature exposer having a wavelength of 436 nm is about 0.7 $\mu$m, and the resolution of i-line miniature exposer having a wavelength of 365 nm is about 0.5 $\mu$m. In order to form a minute pattern below 0.5 $\mu$m, there have been developed a method of employing an exposer using a deep ultra violet ray (DUV) having a small wavelength, such as a KrF laser having a wavelength of 248 nm or an ArF laser having a wavelength of 193 nm, a method of using a phase shift mask as a photo mask, a contrast enhancement layer (CEL) method of forming a thin film for enhancing an image contrast on a wafer, a tri-layer resist (TLR) method of positioning an intermediate layer such as SOG between the two photoresist films, and a silylation method of selectively implanting silicon into an upper side of the photoresist film.

In addition, according to the high integration of the semiconductor device, a size of a contact hole connecting upper and lower conductive interconnections and an interval between the contact hole and the peripheral interconnections are decreased, and an aspect ratio, a rate of a diameter and a depth of the contact hole is increased.

As a result, in the high integration semiconductor device including multi-layer conductive interconnections, it is necessary to precisely strictly align the masks so as to form the contact hole, which results in reduced redundancy of the process.

Accordingly, the masks are formed in consideration of misalignment tolerance in a mask alignment step, lens distortion in an exposure step, critical dimension variation in mask formation and photoetching steps and registration among the masks.

There has been also suggested a self aligned contact (SAC) technique of forming the contact hole according to a self aligned method in order to overcome the limitation of a lithography process in the contact hole formation.

According to the SAC method, a polycrystalline silicon layer, a nitride film or an oxide nitride film may be used as an etching barrier film. Preferably, the nitride film may be employed as the etching barrier film.

A conventional method for fabricating a capacitor of a semiconductor device will now be described, which will not be illustrated in the drawings.

A predetermined substructure, for instance, a device isolation insulating film, a gate insulating film and a MOS field effect transistor (MOSFET) having a gate electrode overlapped with a mask oxide film pattern and source/drain regions are formed on the semiconductor wafer. Thereafter, an etching barrier film and an interlayer insulating film consisting of an oxide film are sequentially stacked on the whole surface of the resultant structure.

A contact hole is formed by forming a photoresist film pattern exposing the interlayer insulating film at a region of the semiconductor wafer where a contact of a storage electrode or bit line will be formed, exposing the etching barrier film by dry-etching the interlayer insulating film exposed by the photoresist film pattern, and re-etching the etching barrier film.

Here, when the polycrystalline silicon is used as the etching barrier film, the etching barrier film may be formed on the whole surface, or a polycrystalline silicon layer pad may be formed at a region where the contact hole will be formed.

The polycrystalline silicon SAC method employs as the etching barrier film the polycrystalline silicon having a different etching layer from the oxide film, thereby increasing an etching selection ratio difference between the polycrystalline silicon and the oxide film.

However, the whole surface deposition method may lower insulation reliability between the contact holes, and the pad formation method may damage the wafer when misalignment takes place between the contact pad and the silicon wafer.

A method for expanding the contact pad by using a spacer or polymer has been suggested to prevent the wafer from being damaged. However, this method is impossible to implement a design rule of "below 0.18 $\mu$m".

The SAC method of employing the nitride film as the etching barrier film has been suggested in order to overcome such a disadvantage.

In a state where the etching selection ratio of the interlayer insulating film and the etching barrier film is at least 5:1, the SAC method removes the nitride film according to the dry etching step, thereby forming the contact hole.

In order to increase the etching selection ratio, the etching step uses a C—H—F gas generating a large amount of polymer or a gas including hydrogen, mixedly with an inactive gas.

In general, the interlayer insulating film consists of a BPSG film having excellent mobility, and thus the cell and peripheral circuit units have superior planarization and gap-fill properties.

A bit line is defined on the BPSG film. The BPSG film that is positioned lower is exposed. Here, the bit line may be shifted or bent differently from the definition on the mask due to the stress resulting from a material difference between the bit line and the BPSG film.

In case the bit lines are formed at regular intervals, the stress between the materials is constant. However, an outermost line of the pattern or a separated bit line may be shifted or bent. Accordingly, a short phenomenon may occur on the metal interconnection contact or storage electrode contact, which results in a fatal fail in the chip.

In addition, according to the high integration of the semiconductor device, a size of the cell is decreased. Thus, a height of the storage electrode is increased to obtain sufficient capacitance. As a result, the aspect ratio rises, and the excess etching step is required.

There is a high possibility of generating the short phenomenon between the devices. As a size of the device becomes smaller, it is difficult to obtain a process margin and an open area of the contact when forming the contact. As the open area of the contact becomes smaller, a contact resistance is increased, and thus an operational speed of the device is decreased.

SUMMARY OF THE INVENTION

Accordingly, it is a primary object of the present invention to provide a method for fabricating a capacitor of a semiconductor device which can prevent a shift phenomenon of a bit line from occurring, by forming a strong pad insulating film having low mobility on a BPSG film in order to reduce the stress between the bit line and the BPSG film that is a lower interlayer insulating film.

In addition, it is another object of the present invention to provide a method for fabricating a capacitor of a semiconductor device which can prevent a short phenomenon from being generated between a storage electrode and a bit line and which can prevent capacitance of the bit line from being increasing, by forming a storage electrode contact plug and the storage electrode according to a self-aligned contact (SAC) method after the formation of the bit line.

In order to achieve the above-described objects of the present invention, a method for forming a capacitor of a semiconductor device comprises the steps of: forming a first interlayer insulating film having a contact plug connecting to a region of a semiconductor wafer where a predetermined substructure is formed, a bit line contact and a storage electrode contact being formed in the region; forming a pad insulating film on the whole surface of the resultant structure having the contact plug and the first interlayer insulating film; forming a stacked structure of a polycrystalline silicon layer, a silicide film and a mask insulating film on the pad insulating film; forming a bit line by etching the stacked structure having the pad insulating film by using a bit line mask as an etching mask; forming an insulating film spacer at the sidewall of the bit line; forming a second interlayer insulating film having a storage electrode contact hole on the bit line; forming the storage electrode contact to be filled in the storage electrode contact hole; and for forming a storage electrode connecting to the storage electrode contact.

In addition, in order to achieve the above-described objects of the present invention, a method for forming a capacitor of a semiconductor device comprises: forming a first interlayer insulating film having a contact plug connecting to a region of a semiconductor wafer where a predetermined substructure is formed, a bit line contact and a storage electrode contact being formed in the region; forming a pad insulating film on the whole surface of the resultant structure having the contact plug and the first interlayer insulating film; forming a stacked structure of a polycrystalline silicon layer, a silicide layer and a mask insulating film on the pad insulating film, and forming a bit line by etching the stacked structure having the pad insulating film by using a bit line mask as an etching mask; forming a first insulating film spacer at the sidewall of the bit line; forming a second interlayer insulating film on the whole surface of the resultant structure; keeping the second interlayer insulating film having a predetermined thickness between the first insulating film spacers, by full-etching the second interlayer insulating film; forming a second insulating film spacer at the sidewall of the residual first insulating film spacer; forming a third interlayer insulating film having an etching selection ratio difference from the second interlayer insulating film on the whole surface of the resultant structure; exposing an upper portion of the second interlayer insulating film by selectively etching the third interlayer insulating film by using a storage electrode contact mask as an etching mask; forming a storage electrode contact hole exposing the contact plug by removing the second interlayer insulating film; forming the storage electrode contact to be filled in the storage electrode contact hole; and forming a storage electrode connecting to the storage electrode contact.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for forming a capacitor of a semiconductor device in accordance with the preferred embodiments of the present invention will now be described with reference to the accompanying drawings.

FIGS. 1 to 6 are cross-sectional views illustrating sequential steps of a method for fabricating a storage electrode of a semiconductor device in accordance with a first embodiment of the present invention.

Figure 1:
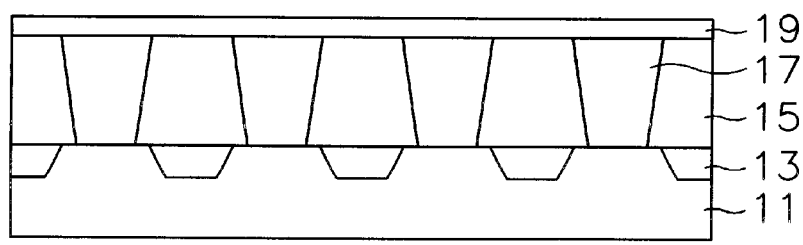
FIGS. 1 to 6 are cross-sectional views illustrating sequential steps of a method for forming a storage electrode of a semiconductor device in accordance with a first embodiment of the present invention.

As illustrated in FIG. 1, a device isolation insulating film 13 and a MOS field effect transistor (MOSFET) (not shown) are formed on the upper portion of a semiconductor wafer 11, thereby forming a substructure. A first interlayer insulating film 15 including a contact plug 17 which connects to a region where a bit line contact and a storage electrode contact will be formed is formed on the whole surface of the resultant structure.

Figure 2:
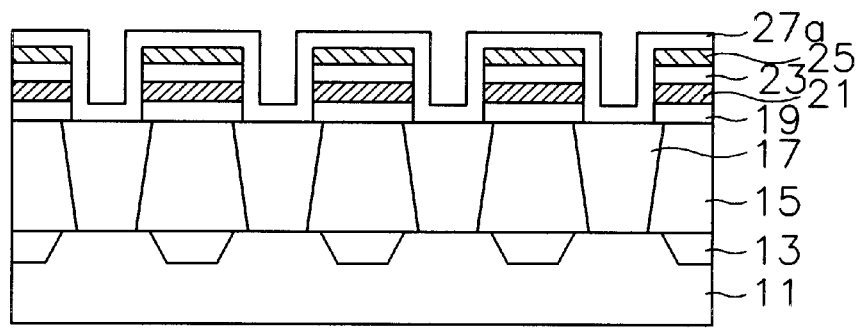

As shown in FIG. 2, a stacked structure of a pad oxide film 19, a first polycrystalline silicon layer 21, a tungsten silicide film 23 and a mask insulating film 25 is formed on the first interlayer insulating film 15. The stacked structure is etched and patterned by using as an etching mask a bit line mask protecting a region where a bit line is formed.

Here, the pad oxide film 19 is selected from the group consisting of a plasma enhanced tetra ethyl ortho silicate glass (PE-TEOS), a low pressure tetra ethyl ortho silicate glass (LP-TEOS), a low temperature oxide (LTO) and a middle temperature oxide (MTO).

The pad oxide film 19 is formed at 200 to 800° C. so that the properties of the MOSFET may not be varied. In addition, the mask insulating film 25 consists of the stacked structure of PE-TEOS/nitride film or SiON film.

When the mask insulating film 25 consists of a nitride film or SiON film, the pad oxide film 19 is not etched during the etching step employing the bit line mask as an etching mask.

Figure 3:
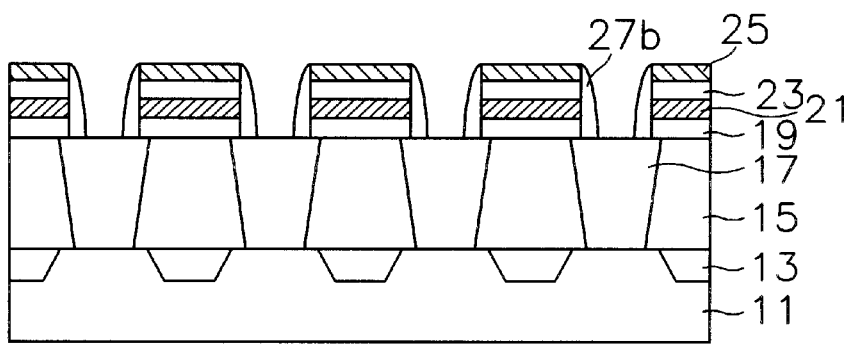

Referring to FIG. 3, a nitride film 27a is formed on the whole surface of the resultant structure and full-etched, thereby forming a nitride film spacer 27b at the sidewall of the stacked structure pattern.

Figure 4:
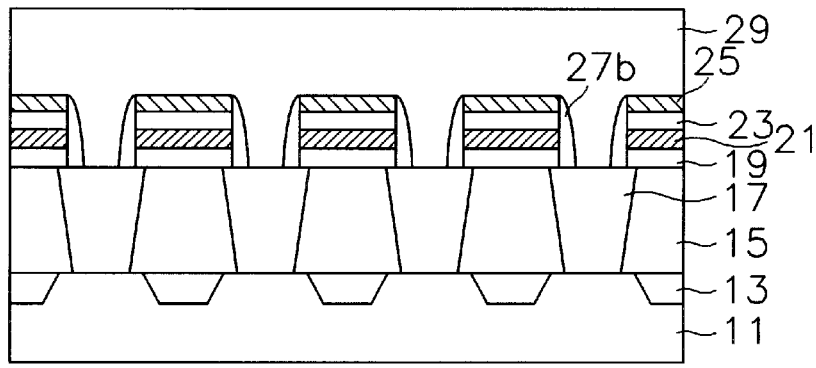

As illustrated in FIG. 4, a second interlayer insulating film 29 is formed by forming a high temperature oxide film having a thickness of 1000 to 15000 Å on the whole surface of the resultant structure, in addition to PSG and BPSG.

Thereafter, the second interlayer insulating film 29 is planarized according to the full-etching step or chemical mechanical polishing (CMP) step.

Figure 5:
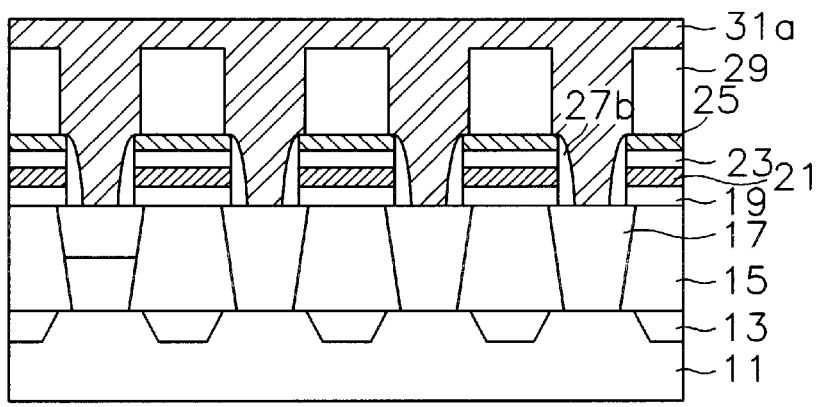
Figure 6:
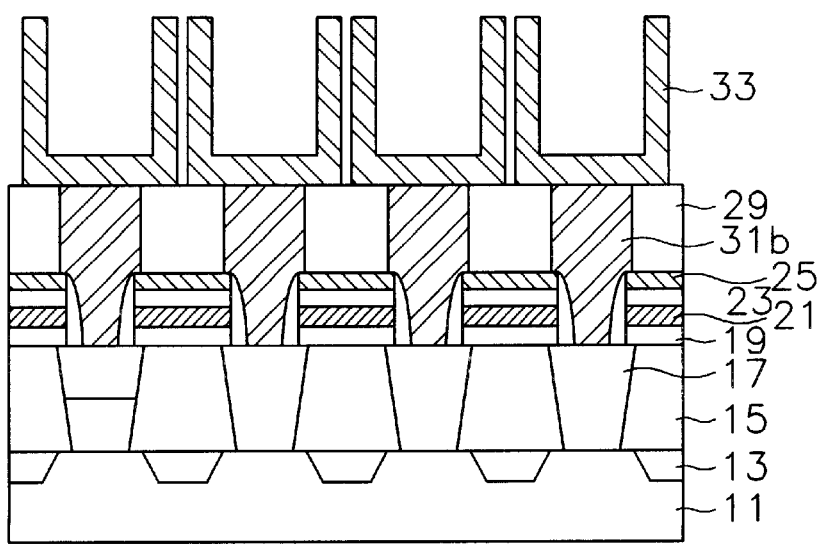

As depicted in FIG. 5, the second interlayer insulating film 29 is etched by using as an etching mask a storage electrode contact mask exposing a region of the contact plug 17 where a storage electrode contact will be formed, thereby forming a storage electrode contact hole (not shown) exposing the contact plug 17.

Thereafter, a second polycrystalline silicon layer 31a to be filled in the storage electrode contact hole is formed on the whole surface of the resultant structure. The second polycrystalline silicon layer 31a is removed according to the full-etching step or CMP step, thereby forming a storage electrode contact 31b to be filled in the storage electrode contact hole. Here, the storage electrode contact 31b is formed to have a thickness of 500 to 5000 Å.

A storage electrode 33 connecting to the storage electrode contact 31b is selectively formed on the whole surface of the resultant structure.

On the other hand, a method for fabricating a semiconductor device in accordance with a second embodiment of the present invention will now be described with reference to FIGS. 7 to 15.

FIGS. 7 to 15 are cross-sectional views illustrating sequential steps of a method for forming a storage electrode of the semiconductor device in accordance with the second embodiment of the present invention.

Figure 7:
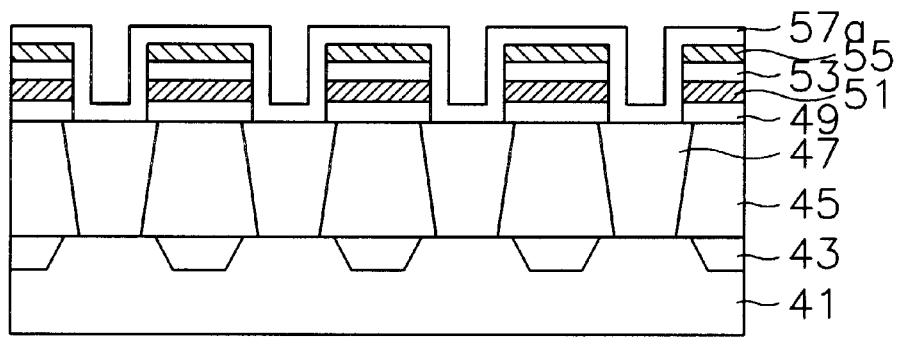
FIGS. 7 to 15 are cross-sectional views illustrating sequential steps of a method for forming a storage electrode of a semiconductor device in accordance with a second embodiment of the present invention.
Figure 8:
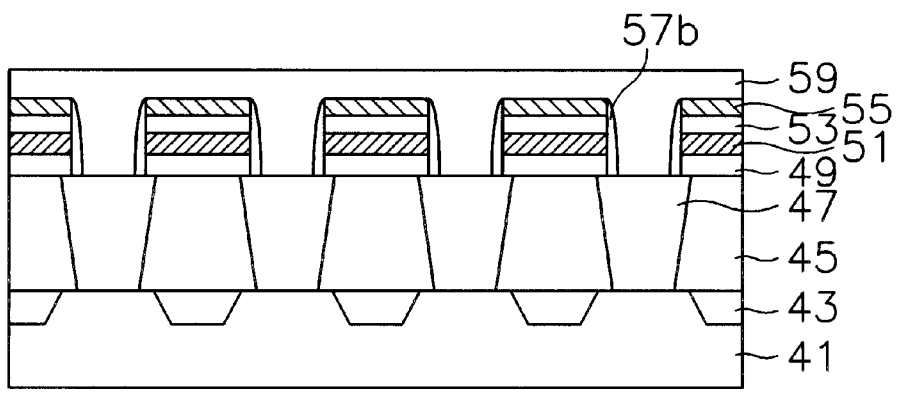

As illustrated in FIGS. 7 and 8, a first nitride film 57a is formed to have a thickness of 100 to 600 Å by repeating the process of FIGS. 1 and 2. The full-etching step is performed, and as a result a first nitride film spacer 57b is formed at the sidewall of the bit line. A second interlayer insulating film 59 is formed on the whole surface of the resultant structure.

Here, the first nitride film 57a may be replaced by an oxide film formed at 550 to 800° C. The second interlayer insulating film 59 consists of $O_3$—PSG or high density plasma oxide film.

Figure 9:
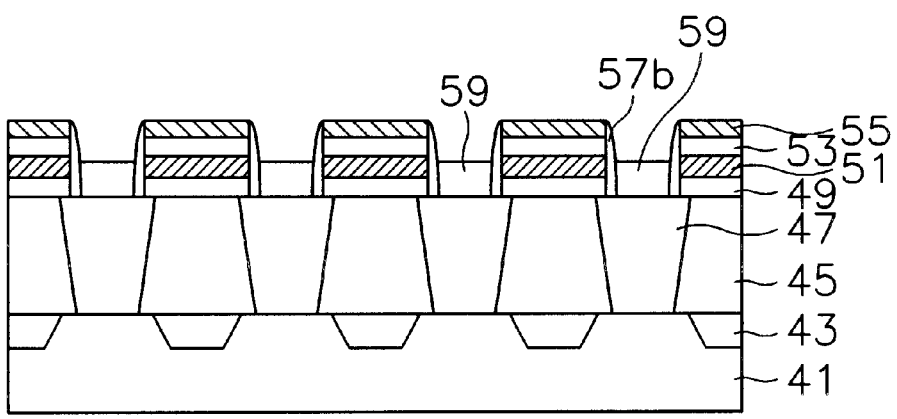

As illustrated in FIG. 9, the second interlayer insulating film 59 is full-etched to remain between the bit lines.

Figure 10:
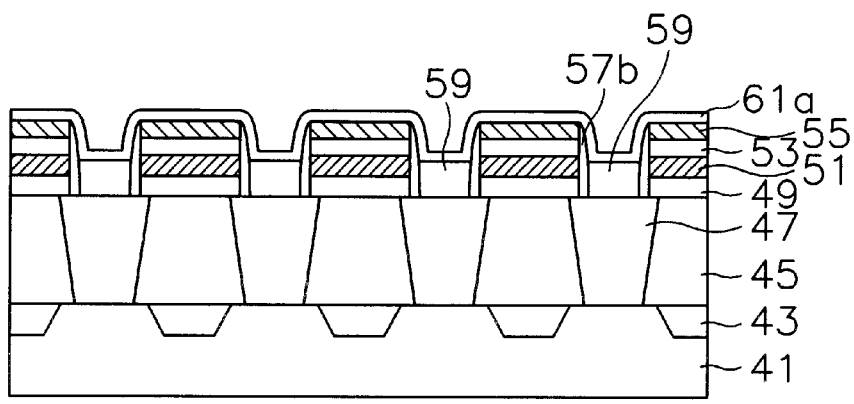

Referring to FIG. 10, a second nitride film 61a is formed to have a thickness of 300 to 600 Å on the whole surface of the resultant structure.

Figure 11:
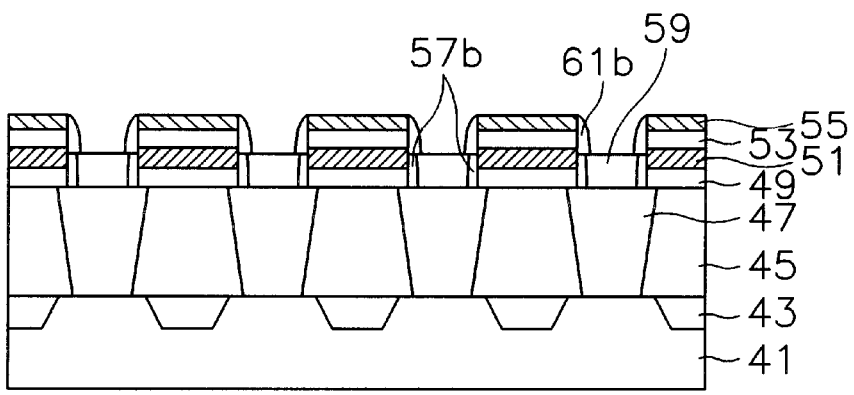

As depicted in FIG. 11, a second nitride film spacer 61b is formed by full-etching the second nitride film 61a.

Here, in order to reduce the SAC etching load of the capacitor, the second nitride film spacer 61b forms a double structure with the first nitride film spacer 57b at a region where the second interlayer insulating film 59 is removed.

Figure 12:
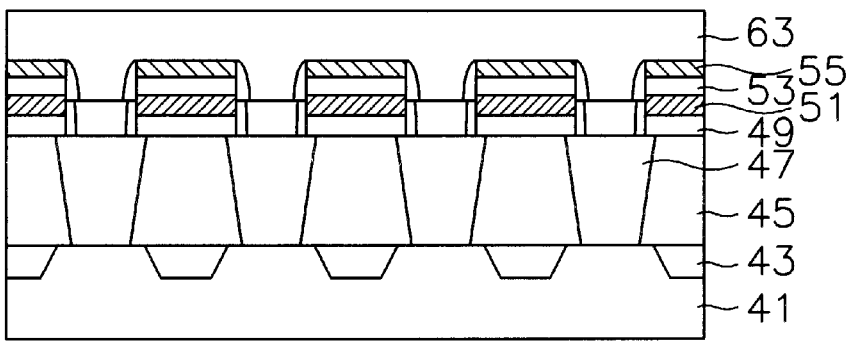

As shown in FIG. 12, a third interlayer insulating film 63 is formed as a thermal oxide film on the whole surface of the resultant structure.

At this time, the third interlayer insulating film 63 is formed by using LTO, MTO or a high temperature oxide (HTO) film having a large etching selection ratio difference from the $O_3$—PSG film that is the first interlayer insulating film 59.

Figure 13:
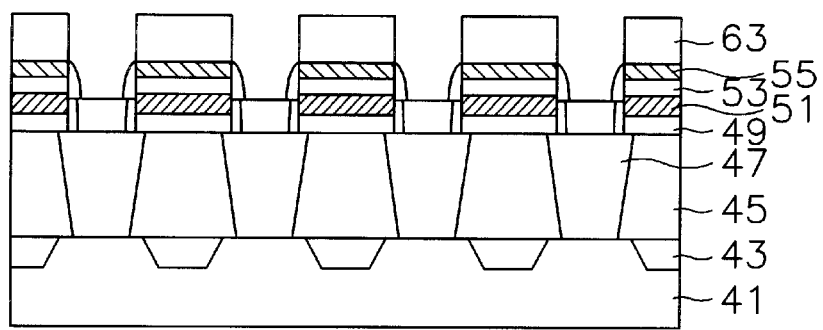

As illustrated in FIG. 13, the third interlayer insulating film 63 is planarized according to the full-etching step or CMP step, and removed according to a wet etching step using as an etching mask a storage electrode contact mask exposing a region where a storage electrode contact will be formed. Here, the $O_3$—PSG film that is the second interlayer insulating film 59 is not etched.

Figure 14:
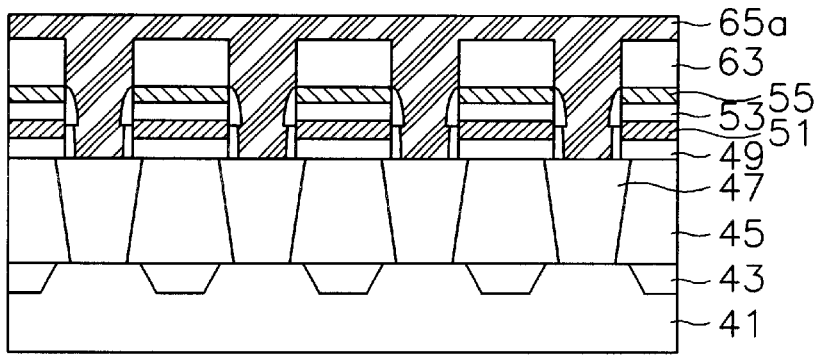

Referring to FIG. 14, the $O_3$—PSG film that is the second interlayer insulating film 59 is completely removed by carrying out a wet etching step with a dilute HF solution diluted at a ratio of 50:1, thereby forming a storage electrode contact hole (not shown) exposing the contact plug 47.

Here, the $O_3$—PSG film that is the second interlayer insulating film 59 has a higher etching speed in the dilute HF solution than the thermal oxide film such as LTO, MTO or HTO that is the third interlayer insulating film 63 by at least 60 times.

The materials of the second interlayer insulating film 59 and the third interlayer insulating film 63 may be changed.

Thereafter, a second polycrystalline silicon layer 65a to be filled in the storage electrode contact hole is formed at the upper portion of the resultant structure.

Figure 15:
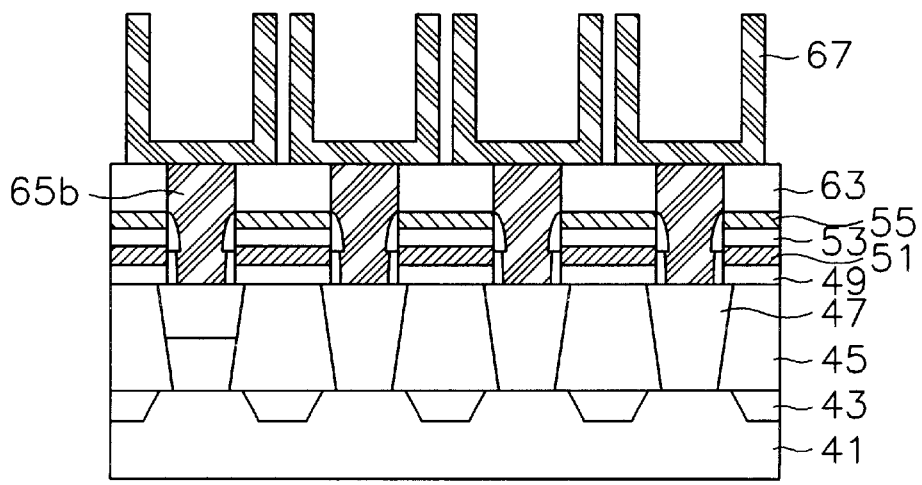

As illustrated in FIG. 15, a storage electrode contact 65b is formed by carrying out the full-etching step or CMP step on the second polycrystalline silicon layer 65a.

A storage electrode 67 connecting to the storage electrode contact 65b is formed.

As discussed earlier, the method for forming the capacitor of the semiconductor device in accordance with the present invention have the following advantages.

Firstly, the load of the etching step is remarkably reduced by forming the capacitor structure after forming the contact in the formation of the contact of the storage node.

In addition, in order to obtain the numerical aperture in the formation of the contact of the storage node, the contact is formed by using the wet etching selection ratio of the oxide film consisting of an insulating material, and the nitride film spacer is formed on the bit line, thereby reducing the SAC etching load of the storage node.

Moreover, in the conventional art, the bit line may be shifted or bent differently from the definition on the mask due to the stress resulting from a material difference between the bit line and the BPSG film. However, in accordance with the present invention, the bit line is formed after depositing the oxide material on the contact plug, thereby preventing the shift or bending phenomenon and the short phenomenon between the metal interconnection contact and the bit line.

Consequently, the open area is obtained during the contact formation step of the storage electrode, the insulating property between the bit line and the storage electrode improves during the SAC etching step for forming the storage electrode contact hole, and the high integration of the semiconductor device is achieved by obtaining a sensing margin of the semiconductor device due to the capacitance reduction of the bit line, thereby enhancing a process yield and properties of the semiconductor device.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for forming a capacitor of a semiconductor device, comprising:

forming a first interlayer insulating film having a contact plug connecting to a region of a semiconductor wafer where a predetermined substructure is formed, a bit line contact and a storage electrode contact being formed in the region;

forming a pad insulating film on the whole surface of the resultant structure having the contact plug and the first interlayer insulating film;

forming a stacked structure of a polycrystalline silicon layer, a silicide layer and a mask insulating film on the pad insulating film, and forming a bit line by etching the stacked structure having the pad insulating film by using a bit line mask as an etching mask;

forming a first insulating film spacer at the sidewall of the bit line;

forming a second interlayer insulating film on the whole surface of the resultant structure;

keeping the second interlayer insulating film having a predetermined thickness between the first insulating film spacers, by full-etching the second interlayer insulating film;

forming a second insulating film spacer at the sidewall of the residual first insulating film spacer;

forming a third interlayer insulating film having an etching selection ratio difference from the second interlayer insulating film on the whole surface of the resultant structure;

exposing an upper portion of the second interlayer insulating film by selectively etching the third interlayer insulating film by using a storage electrode contact mask as an etching mask;

forming a storage electrode contact hole exposing the contact plug by removing the second interlayer insulating film;

forming the storage electrode contact to be filled in the storage electrode contact hole; and forming a storage electrode connecting to the storage electrode contact.

2. The method according to claim 1, wherein the first insulating film spacer is formed by forming and full-etching a nitride film having a thickness of 100 to 600 Å.

3. The method according to claim 1, wherein the first insulating film spacer consists of a thermal oxide film formed at 550 to 800° C.

4. The method according to claim 1, wherein the second insulating film spacer is formed by forming and full-etching a nitride film having a thickness of 300 to 600 Å.

5. The method according to claim 1, wherein the second interlayer insulating film consists of the $O_3$—PSG film, high density plasma oxide film or BPSG film.

6. The method according to claim 1, wherein the third interlayer insulating film consists of a thermal oxide film such as the LTO, MTO or high temperature oxide (HTO) film.

7. The method according to claim 1, wherein the second interlayer insulating film is removed by carrying out a wet etching step with a dilute HF solution.

8. The method according to claim 1, wherein the second interlayer insulating film consists of a thermal oxide film such as the LTO, MTO or high temperature oxide (HTO) film.

9. The method according to claim 1, wherein the third interlayer insulating film consists of the $O_3$—PSG film, high density plasma oxide film or BPSG film.

10. The method according to claim 1, wherein the pad insulating film is an oxide film formed at 200 to 800° C.

11. The method according to claim 1, wherein the pad insulating film consists of one of a plasma enhanced tetra ethyl ortho silicate glass (PE-TEOS), a low pressure tetra ethyl ortho silicate glass (LP-TEOS), a low temperature oxide (LTO) and a middle temperature oxide (MTO).

12. The method according to claim 1, wherein the mask insulating film consists of the stacked structure of PE-TEOS/nitride film or SiON film.

* * * * *